United States Patent
Vaniapura et al.

(10) Patent No.: US 10,599,039 B2
(45) Date of Patent: Mar. 24, 2020

(54) STRIP PROCESS FOR HIGH ASPECT RATIO STRUCTURE

(71) Applicants: Mattson Technology, Inc., Fremont, CA (US); Beijing E-Town Semiconductor Technology, Co., LTD, Beijing (CN)

(72) Inventors: Vijay M. Vaniapura, Tracy, CA (US); Shawming Ma, Sunnyvale, CA (US); Li Hou, Cupertino, CA (US)

(73) Assignees: MATTSON TECHNOLOGY, INC., Fremont, CA (US); BEIJING E-TOWN SEMICONDUCTOR TECHNOLOGY, CO., LTD, Beijing (CN)

( * ) Notice: Subject to any disclaimer, the term of this patent is extended or adjusted under 35 U.S.C. 154(b) by 118 days.

(21) Appl. No.: 15/597,283

(22) Filed: May 17, 2017

(65) Prior Publication Data
US 2018/0074409 A1 Mar. 15, 2018

Related U.S. Application Data

(60) Provisional application No. 62/456,911, filed on Feb. 9, 2017, provisional application No. 62/394,242, filed on Sep. 14, 2016.

(51) Int. Cl.
*G03F 7/42* (2006.01)
*B08B 7/00* (2006.01)
(Continued)

(52) U.S. Cl.
CPC ............ *G03F 7/427* (2013.01); *B08B 7/0014* (2013.01); *B08B 7/0035* (2013.01);
(Continued)

(58) Field of Classification Search
None
See application file for complete search history.

(56) References Cited

U.S. PATENT DOCUMENTS 6,207,583 B1 3/2001 Dunne et al.
6,805,139 B1 10/2004 Savas et al.
(Continued)

FOREIGN PATENT DOCUMENTS

KR 10/2013/0093038 8/2013
WO WO2001/029879 4/2001

OTHER PUBLICATIONS

PCT International Search Report for corresponding PCT Application No. PCT/US2017/033047, dated Jul. 28, 2017—3 pages.
(Continued)

*Primary Examiner* — Mikhail Kornakov
*Assistant Examiner* — Pradhuman Parihar
(74) *Attorney, Agent, or Firm* — Dority & Manning, P.A.

(57) ABSTRACT

Processes for removing a mask layer (e.g., doped amorphous carbon mask layer) from a substrate with high aspect ratio structures are provided. In one example implementation, a process can include depositing a polymer layer on at least a portion of a top end of a high aspect ratio structure on a substrate. The process can further include removing at least a portion of the polymer layer and the doped amorphous carbon film form the substrate using a plasma strip process. In example embodiments, depositing a polymer layer can include plugging one or more high aspect ratio structures with the polymer layer. In example embodiments, depositing a polymer layer can include forming a polymer layer on a sidewall of one or more high aspect ratio structures.

11 Claims, 5 Drawing Sheets

(51) Int. Cl.
*H01L 21/311* (2006.01)
*H01L 21/308* (2006.01)
*H01L 21/3105* (2006.01)

(52) U.S. Cl.
CPC ...... *H01L 21/3081* (2013.01); *H01L 21/3105* (2013.01); *H01L 21/31122* (2013.01); *H01L 21/31144* (2013.01)

(56) References Cited

U.S. PATENT DOCUMENTS

| | | | |
|---|---|---|---|
| 2003/0104697 A1 | 6/2003 | Chang et al. | |
| 2004/0084150 A1 | 5/2004 | George et al. | |
| 2004/0157457 A1* | 8/2004 | Xu | H01L 21/28114 438/694 |
| 2005/0087893 A1* | 4/2005 | Chung | H01L 21/02057 438/294 |
| 2005/0230047 A1* | 10/2005 | Collins | H01J 37/32082 156/345.33 |
| 2006/0084222 A1 | 4/2006 | Rennie et al. | |
| 2007/0287291 A1 | 12/2007 | George et al. | |
| 2011/0163420 A1* | 7/2011 | Valdivia | H01L 21/0273 257/618 |
| 2014/0213059 A1 | 7/2014 | Doan et al. | |
| 2015/0004797 A1 | 1/2015 | Nagarah et al. | |
| 2015/0200109 A1* | 7/2015 | Kong | H01L 21/31144 438/703 |
| 2015/0243521 A1* | 8/2015 | Ogawa | H01L 21/31116 438/714 |
| 2016/0005602 A1* | 1/2016 | Yoo | H01L 21/0338 216/41 |

OTHER PUBLICATIONS

PCT International Preliminary Report on Patentability for corresponding PCT Application No. PCT/US2017/033047, dated Mar. 19, 2019, 9 pages.

* cited by examiner

STRIP PROCESS FOR HIGH ASPECT RATIO STRUCTURE

PRIORITY CLAIM

The present application claims the benefit of priority of U.S. Provisional Application Ser. No. 62/394,242, titled "Strip Process for High Aspect Ratio Structure," filed on Sep. 14, 2016 which is incorporated herein by reference. The present application claims the benefit of priority of U.S. Provisional Application Ser. No. 62/456,911, titled "Strip Process for High Aspect Ratio Structure," filed on Feb. 9, 2017, which is incorporated herein by reference.

FIELD

The present disclosure relates generally to the removal of mask materials and, more particularly, to processes for removing mask materials from semiconductor materials with high aspect ratio structures.

BACKGROUND

Carbon contained hard masks, such as amorphous carbon layers (ACL) or pattern definition film (PDF), have been widely adapted for use as masking material for etching high aspect ratio structures, such as DRAM or 3D NAND devices (e.g., for applications such as OCS etch in DRQAM or high aspect ratio contact etch in 3D NAND). Etching or stripping processes with high aspect ratio structures can pose several challenges.

For example, a substrate can include a patterned area with high aspect ratio structures and an unpatterned area without high aspect ratio structures. A strip process performed after etching can require removal of a carbon hard mask in both the patterned area and the unpatterned area before wet clean. However, the remaining mask after etch in the patterned area can be much thinner than the unpatterned area due to, for instance, pattern proximity effect and stronger mask erosion from ion bombardment dielectric plasma etch, etc. As a result, the patterned area can experience much longer over strip than the unpatterned area during processes intended to remove the carbon mask cleanly everywhere on the substrate.

It is increasingly becoming required to have higher mask selectivity during etch processes of high aspect ratio structures. Accordingly, dopant (e.g., boron) can be added into the carbon mask materials to create doped amorphous carbon (DaC) films to enhance mask selectivity. However, with traditional strip processes, the mask removal rate of the DaC films has been much lower than the removal rate that can be reached with conventional amorphous carbon film using traditional strip processes.

SUMMARY

Aspects and advantages of embodiments of the present disclosure will be set forth in part in the following description, or may be learned from the description, or may be learned through practice of the embodiments.

One example aspect of the present disclosure is directed to a strip process for removing at least a portion of a doped amorphous carbon film from a substrate having high aspect ratio structures. The strip process can include depositing a polymer layer on at least a portion of a top end of a high aspect ratio structure on the substrate; and removing at least a portion of the polymer layer and the doped amorphous carbon layer from the substrate using a plasma strip process.

Other example aspects of the present disclosure are directed to systems, methods, processes, and apparatus for conducting a strip process to remove at least a portion of a mask layer from a substrate having high aspect ratio structures.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
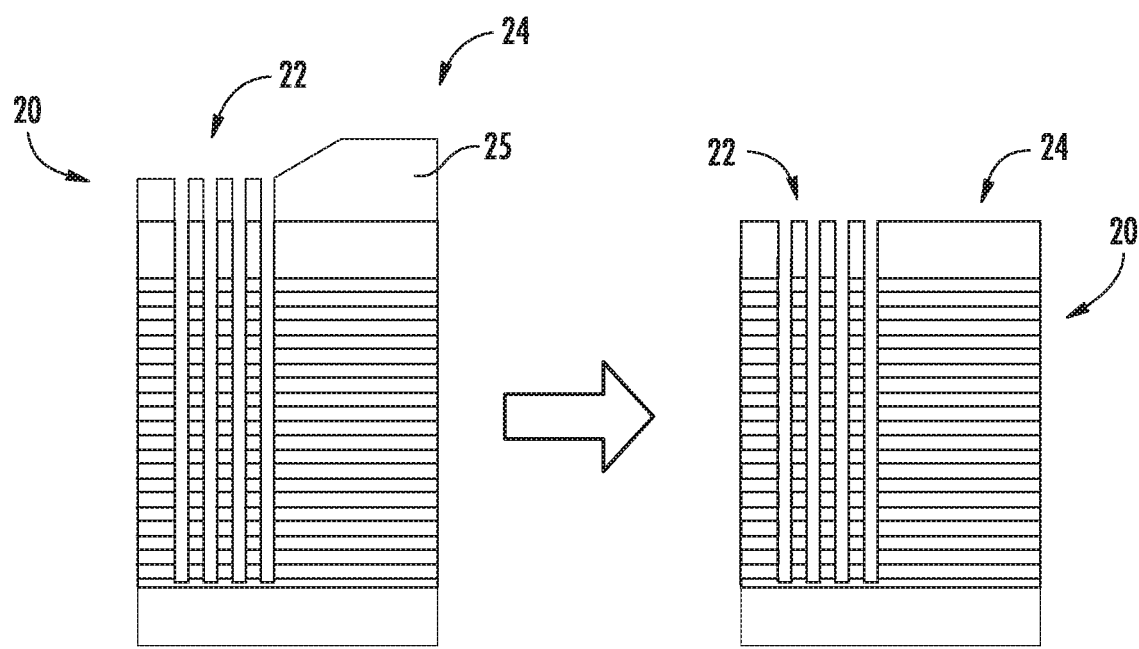
FIG. 1 depicts an example post etch strip process of a carbon hard mask.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to post etch strip processes that can be used to remove a hard mask layer during processing of substrates with high aspect ratio structures. Carbon contained hard mask is widely used for high aspect ratio dielectric etch processes (e.g., for both DRAM and 3D NAND). However, it can be difficult to strip the hard mask after the dielectric etch process and not damage the etched structure of the high aspect ratio structures during the strip process. In addition, the use of doped amorphous carbon hard masks can make it difficult to remove the carbon hard mask fast enough while at the same time having good selectivity between the hard mask and the underlying layers (e.g., multi-layer nitride and oxide of the high aspect ratio structures) during the strip process.

According to example aspects of the present disclosure, post-etch strip processes for removing a hard mask layer can include depositing a carbon contained polymer inside the high aspect ratio structures to protect the sidewall and other surfaces of high aspect ratio structures. The substrate can then be exposed to a plasma strip process to remove the hard mask. The substrate can then be processed to remove the deposited polymer and to clean the chamber. In this way, the selectivity of the strip process between the hard mask and the underlying films of the high aspect ratio structure can be reduced.

Aspects of the present disclosure are discussed with reference to a "wafer" or semiconductor wafer as a substrate for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within 10% of the stated numerical value.

Moreover, aspects of the present disclosure are discussed with reference to removal of a doped amorphous carbon mask layer. Those of ordinary skill in the art, using the disclosures provided herein, will understand that aspects of the present technology can be applicable to removal of other mask layers without deviating from the scope of the present disclosure.

One example embodiments of the present disclosure is directed to a process for removing at least a portion of a doped amorphous carbon film from a substrate having high aspect ratio structures. The process includes depositing a polymer layer on at least a portion of a top end of a high aspect ratio structure on a substrate. The process includes removing at least a portion of the polymer layer and the doped amorphous carbon film from the substrate using a plasma strip process.

In some embodiments, depositing a polymer layer can include plugging one or more high aspect ratio structures with the polymer layer. In some embodiments, depositing the polymer layer can include forming a polymer layer on a sidewall of one or more high aspect ratio structures.

The polymer layer can be formed using polymer deposition with one or more of $CHF_3$, $H_2$, $N_2$, Ar or their combination. The polymer layer can be formed using a gas $C_xH_yF_z$ combined with any $H_2$ or any $C_{x1}H_{y1}$, where x, y, z, x1, and y1 are integers. The polymer layer can be formed at a pressure in the range of about 10 mTorr to about 5 Torr.

In some embodiments, depositing a polymer layer is performed in an etch chamber and removing at least a portion of the polymer layer and the doped amorphous carbon film is performed in a strip chamber. In some embodiments, depositing a polymer layer and removing at least a portion of a polymer layer and the doped amorphous carbon film are performed in the same chamber. In some embodiments, depositing a polymer layer and removing at least a portion of a polymer layer and the doped amorphous carbon film are repeated until the doped amorphous carbon layer is removed from the substrate.

In some embodiments, the plasma strip process can use a plasma formed using a mixture of an oxygen containing gas, a halogen containing gas, and a reducing gas that includes hydrogen. A ratio of the reducing gas to the halogen containing gas can be in the range of about 0.001 to about 3.

Another example embodiment of the present disclosure is directed to a process for removing at least a portion of a mask layer from a substrate having a patterned area with one or more high aspect ratio structures. The process includes placing a substrate on a substrate holder in a plasma processing apparatus (e.g., a strip chamber). The process includes performing a polymer deposition process in the plasma processing apparatus to deposit a polymer layer on at least a portion of the patterned area of the substrate. Performing a plasma strip process in the plasma processing apparatus to remove at least a portion of the polymer layer and at least a portion of the mask layer from the substrate.

In some embodiments, the polymer deposition process clogs one or more high aspect ratio structures with the polymer layer. In some embodiments, the polymer deposition process forms a polymer layer on a sidewall of one or more high aspect ratio structures.

The polymer layer can be formed using polymer deposition with one or more of $CHF_3$, $H_2$, $N_2$, Ar or their combination. The polymer layer can be formed using a gas $C_xH_yF_z$ combined with any $H_2$ or any $C_{x1}H_{y1}$, where x, y, z, x1, and y1 are integers. The polymer layer can be formed at a pressure in the range of about 10 mTorr to about 5 Torr.

Another example embodiment of the present disclosure is directed to a process for removing at least a portion of a mask layer from a substrate having a patterned area with one or more high aspect ratio structures. The process includes placing a substrate in a first plasma processing apparatus. The process includes performing a polymer deposition process in the first plasma processing apparatus to deposit a polymer layer on at least a portion of the patterned area of the substrate. The process includes transferring the substrate to a second plasma processing apparatus. The process includes performing a plasma strip process in the second plasma processing apparatus to remove at least a portion of the polymer layer and at least a portion of the mask layer from the substrate. In some embodiments, the first plasma processing apparatus includes an etch chamber. The second plasma processing apparatus includes a strip chamber.

With reference now to the FIGS., example embodiments of the present disclosure will now by discussed in detail. FIG. 1 depicts an example post etch strip process of a carbon hard mask 25 on a substrate 20 including a patterned area 22 having high aspect ratio structures and an unpatterned area 24 without high aspect ratio structures. As shown in FIG. 1, the carbon hard mask 25 remaining in the unpatterned area 24 after the dielectric etch process is thicker than the carbon hard mask 25 remaining in the patterned area 22 including the high aspect ratio structures. Accordingly, to remove the hard mask 25 from all areas of the substrate 20 during a strip process, the patterned area 22 may experience much longer overstrip during the strip process.

A doped amorphous carbon hard mask (e.g. boron doped amorphous carbon hard mask) can be used to obtain higher mask selectivity during the plasma etch process. An example requirement of mask removal during the strip process can require more than 5000 angstroms per minute. It is possible to achieve such requirement by use of a $CF_4$ addition into the $O_2/N_2$ or $H_2/N_2$ strip chemistry. However, such chemistry with $CF_4$ addition can also damage the underneath oxide and nitride layer of the high aspect ratio structures during the strip process for removing the hard mask.

For example, after stripping a boron doped amorphous carbon hard mask on the patterned area, plenty of the boron doped amorphous carbon hard mask remains at the unpatterned area. As a result, overstrip in the patterned area can be required to remove the doped amorphous carbon hard mask in the unpatterned area. For instance, in some implementations, it is possible to have more than 300% overstrip in the patterned area. Due to this overstrip, there can be a very stringent requirement of oxide and nitride selectivity during the strip process. Typical requirement of the strip selectivity needs to be more than 500:1 and ideally to be more than 1000:1 of the patterned area relative to the unpatterned area. If we do not have such selectivity, the underneath high aspect ratio structure can be damaged. Nevertheless, such selectivity requirement can slow down the strip process and make the use of doped amorphous carbon layers as mask materials questionable even though it can have high performance during the high aspect ratio etch process.

According to example aspects of the present disclosure, the selectivity requirement between the patterned area and unpatterned areas during a strip process for removal of hard masks from a substrate can be reduced by plugging or forming a polymer on the top end of the high aspect ratio structures of the patterned area prior to performing the mask removal. More particularly, gasses such as $CHF_3$, $H_2$, $N_2$, Ar or their combination can be used to form a polymer at a pressure in the range of 10 mTorr to 5 Torr and a temperature of less than 100° C. The polymer can be deposited into the high aspect ratio structures of the patterned area to clog the high aspect ratio structures so the underneath nitride or oxide will reduce exposure time to the aggressive overstrip chemistry during the strip process. This process can be repeated until the majority of the mask is removed from both the patterned area and the unpatterned area on the substrate. In some embodiments, the protection layer formed by the polymer deposition can be done in-situ in a strip chamber followed by the aggressive strip process to remove the protection layer and the mask layer. In some embodiments, the polymer deposition can be performed in an etch chamber after a dielectric etch process. The substrate can be transferred to a strip chamber for stripping the polymer and hard mask according to example embodiments of the present disclosure. The polymer deposition can be performed using any suitable deposition process, such as chemical vapor deposition.

FIG. 2 depicts an overview of a strip process for removing a hard mask 55 from a substrate 50 including a patterned area 52 having one or more high aspect ratio structures and an unpatterned area 54. The high aspect ratio structures in the patterned area 54 can be formed at least in part from alternating layers of oxide and nitride sandwiched between silicon. The hard mask 55, in some embodiments, can be a doped amorphous carbon hard mask (e.g. a boron doped amorphous hard mask).

Figure 2A:
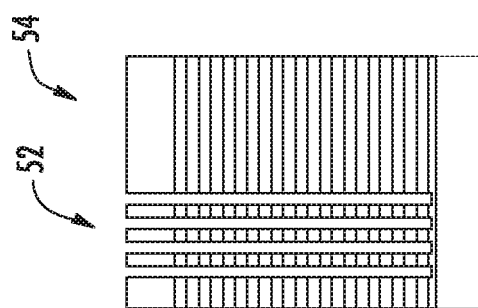
FIGS. 2(a), 2(b), 2(c), and 2(d) depict an example strip process according to example embodiments of the present disclosure.
Figure 2B:
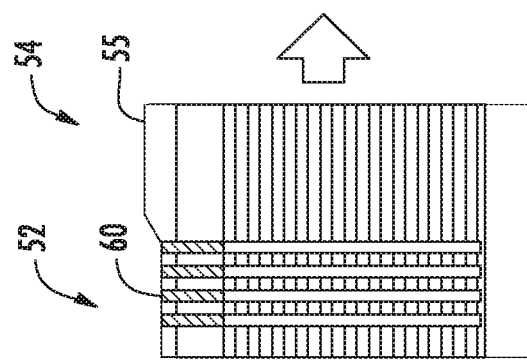

FIG. 2(a) shows a substrate 50 after a dielectric etch process. As shown, the substrate 50 includes a hard mask 55. The hard mask 55 is thicker over the unpatterned area 54 relative to the patterned area 52. As shown in FIG. 2(b), a first step can include depositing a polymer layer 60 on the substrate 50. The polymer layer 60 can be a polymer layer formed using a polymer deposition process. As shown, the polymer layer 60 can plug or clog the high aspect ratio structures in the patterned area 52.

In some embodiments, the polymer layer 60 can be formed on the substrate 50 in situ (while the substrate is in a processing chamber) during the strip process. For instance, gasses such as $CH_4$, $H_2$, $N_2$, Ar, or combination thereof can be provided in a processing chamber to form a polymer at a pressure in the range of 10 mTorr to 5 Torr and deposit the polymer as a polymer layer 60 clogging one or more of the high aspect ratio structures in the patterned area 52 on the substrate 50. Other possible gases can be used for polymer deposition. For instance, $C_xH_yF_z$ can combine with any of other $H_2$, $C_xH_y$ ($CH_4$, $C_2H_4$, $C_3H_6$, $C_4H_8$, etc.) to form the polymer layer 60. In some embodiments, the polymer layer can be deposited at lower pressures, such as at pressures less than 100 mTorr. For instance, the polymer layer can be deposited in an etch processing chamber at pressures less than 100 mTorr. In some embodiments, the polymer layer can be deposited at temperatures less than 100° C.

Figure 2C:
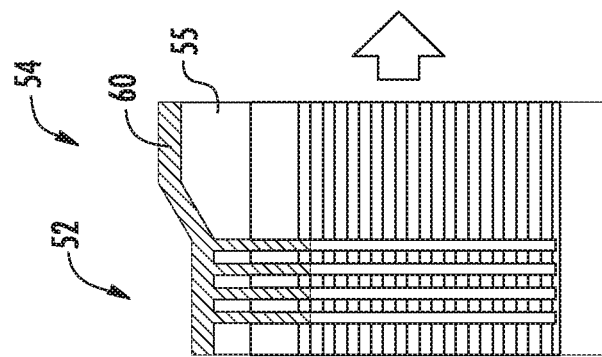
Figure 2D:
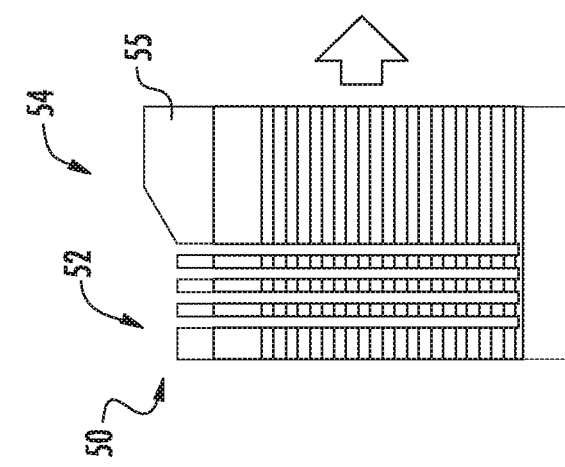

As shown in FIG. 2(c), the polymer deposition step can be followed by a doped amorphous carbon layer (e.g. boron doped amorphous carbon layer) strip process to slowly remove the protection layer 60 and hard mask 55 from the substrate. In some embodiments, the process of FIGS. 2(b) and 2(c) can be repeated multiple times until the substantially all of the hard mask 55 is removed as shown in FIG. 2(d).

Figure 3:
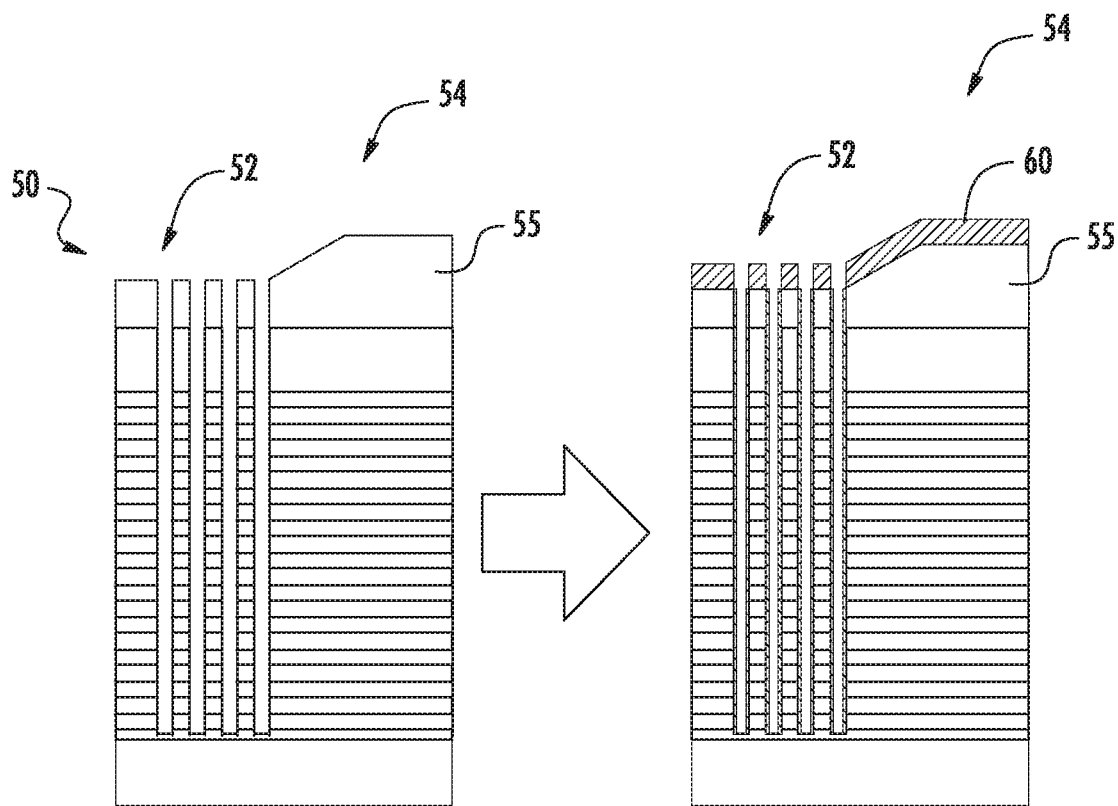
FIG. 3 depicts an example strip process according to example embodiments of the present disclosure.

In some embodiments, the step of depositing a polymer layer 60 may not include clogging the high aspect ratio structures as shown in FIG. 2(b). Rather, the polymer layer may be deposited along the sidewalls of the high aspect ratio structures as shown in FIG. 3. The polymer deposition step can be followed by a doped amorphous carbon layer (e.g. boron doped amorphous carbon layer) strip process to slowly remove the protection layer 60 and hard mask 55 from the substrate. Details concerning an example strip process for mask removal are provided below. The polymer deposition process and the strip process can be repeated multiple times until the substantially all of the hard mask 55 is removed as shown in FIG. 2(d).

The use of a polymer deposition process to provide a polymer layer on a substrate prior to stripping a hard mask from a substrate according to example aspects of the present disclosure can reduce the selectivity requirement of the strip process between patterned and unpatterned areas on a substrate and can enlarge the process window. This can make the use of a doped amorphous carbon hard mask (e.g. a boron doped amorphous carbon hard mask) more feasible. The strip process can be performed with a lower cost plasma strip chamber.

The methods by which a polymer layer can be deposited and a doped amorphous carbon mask substrate can be removed according to example aspects of the present disclosure can be carried out in the plasma reactor. In one particular embodiment, a downstream inductively coupled plasma (ICP) source can be utilized. However, the mask removal strip process of the present disclosure also contemplates other plasma technologies such as microwave downstream strip technology or parallel plate/inductively coupled plasma etch technologies. Inductive plasma sources are often used for plasma processing to produce high density plasma and reactive species for processing semiconductor substrates. For instance, inductive plasma sources can easily produce high density plasma using standard 13.56 MHz and lower frequency power generators. Inductive plasma sources combined with RF bias have also been used in etchers, for example, to provide independent control of ion energy and ion flux to the wafer.

For certain plasma strip processes such as mask removal, it is generally not desirable to expose the semiconductor wafers directly to the plasma. In this regard, the plasma can be formed remotely (e.g., downstream) from the processing chamber, after which the desired particles are channeled to the semiconductor substrate, for example, through a grid that is transparent to neutral particles and not transparent to the plasma. Such processes can require high RF power (e.g., up to about 6,000 watts (W)) and in some cases high gas flows (e.g., about 20,000 standard cubic centimeters per minute (sccm)) and high pressure (e.g., up to about 5,000 milliTorr (mTorr)). In some embodiments, the polymer deposition process can occur in a separate chamber, such an etch chamber and transferred to a strip chamber for stripping a doped amorphous carbon hard mask according to example embodiments of the present disclosure.

Figure 4:
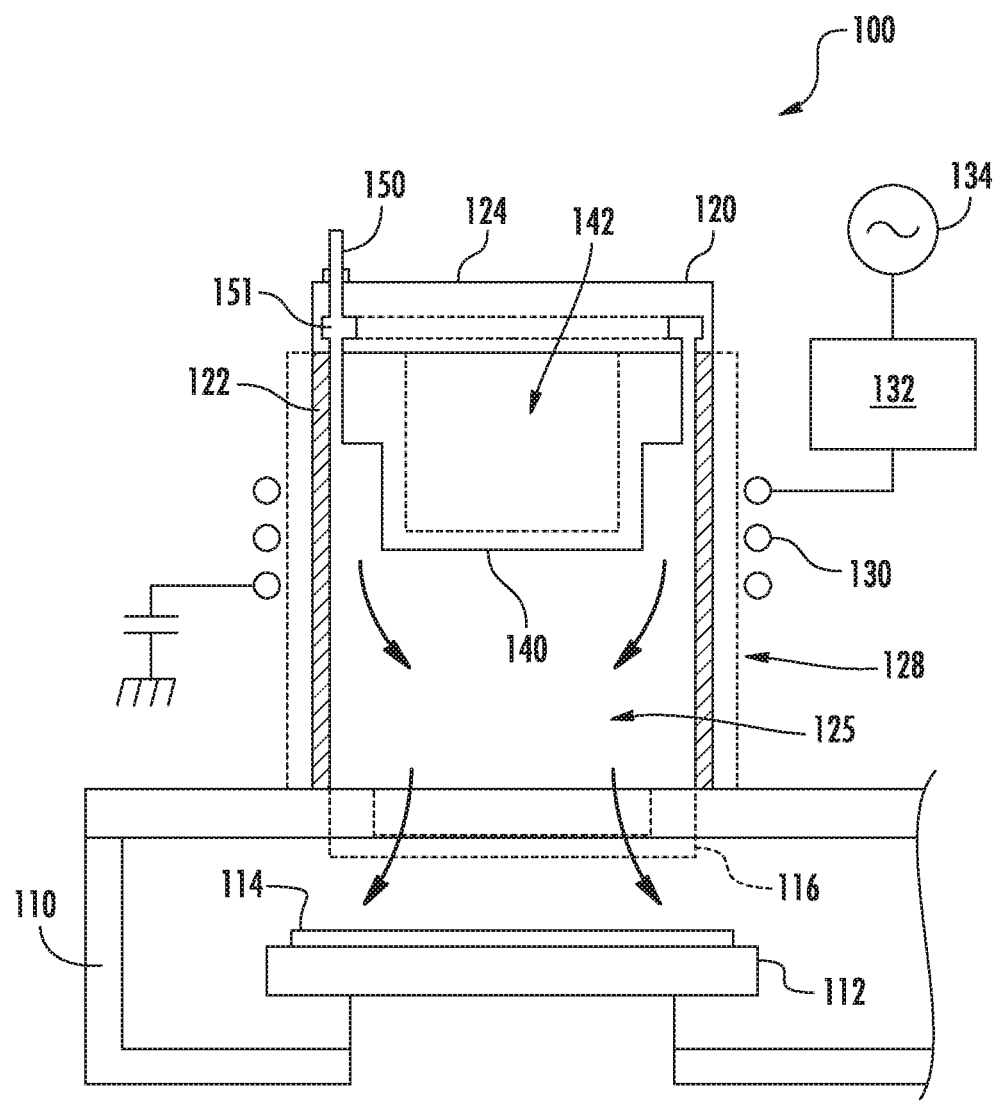
FIG. 4 depicts an example plasma processing apparatus for conducting a strip process according to example embodiments of the present disclosure.

FIG. 4 depicts an example plasma processing apparatus 100 that can be used in the processes embodied by the present disclosure. To first order, it is expected that parameters such as flow rate and RF power will scale with the surface area of the wafer, such that, for instance, a 450 mm wafer (1590 cm2 area) requires 2.25 times the gas flow and power of a 300 mm wafer (707 cm2 area), while a 200 mm wafer (314 cm2 surface area), requires 0.44 times the flow and power of a 300 mm wafer (707 cm2 surface area). It is also to be understood that any other suitable plasma reactor can be utilized, as would be known by one having ordinary skill in the art, without deviating from the scope of the present disclosure, including but not limited to microwave technology or parallel plate technology.

As illustrated, plasma reactor 100 includes a processing chamber 110 and a plasma chamber 120 that is separate from the processing chamber 110. The processing chamber 110 includes a substrate holder or pedestal 112 operable to hold a substrate 114 from which a mask is to be removed. An inductive plasma is generated in plasma chamber 120 (i.e., plasma generation region) and desired particles are then channeled from the plasma chamber 120 to the surface of substrate 114 through holes provided in a grid 116 that separates the plasma chamber 120 from the processing chamber 110 (i.e., downstream region).

The plasma chamber 120 includes a dielectric side wall 122 and a ceiling 124. The dielectric side wall 122 and ceiling 124 define a plasma chamber interior 125. Dielectric side wall 122 can be formed from any dielectric material, such as quartz. An induction coil 130 is disposed adjacent the dielectric side wall 122 about the plasma chamber 120. The induction coil 130 is coupled to an RF power generator 134 through a suitable matching network 132. Reactant and carrier gases can be provided to the chamber interior from gas supply 150 and annular gas distribution channel 151. When the induction coil 130 is energized with RF power from the RF power generator 134, a substantially inductive plasma is induced in the plasma chamber 120. In a particular embodiment, the plasma reactor 100 can include an optional faraday shield 128 to reduce capacitive coupling of the induction coil 130 to the plasma.

To increase efficiency, the plasma reactor 100 can optionally include a gas injection insert 140 disposed in the chamber interior 125. The gas injection insert 140 can be removably inserted into the chamber interior 125 or can be a fixed part of the plasma chamber 120. In some embodiments, the gas injection insert can define a gas injection channel proximate the side wall of the plasma chamber. The gas injection channel can feed the process gas into the chamber interior proximate the induction coil and into an active region defined by the gas injection insert and side wall. The active region provides a confined region within the plasma chamber interior for active heating of electrons. The narrow gas injection channel prevents plasma spreading from the chamber interior into the gas channel. The gas injection insert forces the process gas to be passed through the active region where electrons are actively heated.

In some embodiments, the mask removal methods according to example methods of the present disclosure can be carried out on substrates that include high aspect ratio trenches formed by alternating layers of oxide and nitride sandwiched between silicon. In some instances, the number of oxide and nitride layers can be as high as 15 or more, such as about 20 to 25.

Regardless of the number and specific type of plasma treatments, the plasma used in removing a doped amorphous carbon mask from a substrate can include a mixture of an oxygen containing gas, a halogen containing gas, and a reducing gas that contains hydrogen. The oxygen containing gas can include but is not limited to carbon dioxide (CO2), carbon monoxide (CO), nitrous oxide (N2O), or combinations thereof. The halogen containing gas can include fluorine and can, in some embodiments, be represented by the formula CHxFy. In one embodiment, the halogen containing gas can be tetrafluoromethane ($CF_4$), although it is to be understood, using the disclosures provided herein, that any suitable halogen containing gas can be utilized as would be known to one having ordinary skill in the art. The reducing gas containing hydrogen can be molecular hydrogen ($H_2$), ammonia ($NH_3$), methane ($CH_4$), or a diluted gas mixture containing hydrogen. Dilution with an inert gas can also be used as part of the gas mixture. In certain embodiments, the inert gas can include nitrogen ($N_2$) or noble gases such as argon (Ar) or helium (He), or combinations thereof.

Regardless of the specific oxygen containing gas, halogen containing gas, or reducing gas utilized in example mask removal processes of the present disclosure, the halogen containing gas can be present in an amount that is from about 0.25% to about 4% of the total gas volume, such as from about 0.5% to about 3% of the total gas volume, such as from about 1% to about 2% of the total gas volume. Further, the ratio of the concentration of the hydrogen containing reducing gas to the halogen containing gas (such as the ratio of H2 to CF4) can be from 0 to 3. In some embodiments, the ratio of the hydrogen containing gas to halogen containing gas ranges from about 0.001 to about 3, such as from about 0.002 to about 2.0, such as from about 0.8 to about 1.8.

The oxygen containing gas, halogen containing gas, and reducing gas (i.e., hydrogen containing gas) and optional inert gas can be introduced into the plasma generation chamber and processing chamber at various flow rates. For instance, when treating two substrates each having a diameter of about 300 mm, the oxygen containing gas can have a flow rate of from about 50 to about 20,000 sccm, such as from about 1,000 sccm to about 10,000 sccm, such as from about 3,000 sccm to about 8,000 sccm. Meanwhile, the halogen containing gas can have a flow rate of from about 10 sccm to about 400 sccm, such as from about 20 sccm to about 200 sccm, such as from about 30 sccm to about 160 sccm. Further, the hydrogen containing reducing gas can have a flow rate of from about 30 sccm to about 600 sccm, such as from about 50 sccm to about 400 sccm, such as from about 100 sccm to about 200 sccm. In addition, the inert gas can have a flow rate of from about 0 sccm to about 10,000 sccm, such as from about 10 sccm to about 8,000 sccm, such as from about 20 sccm to about 6,000 sccm.

Based on the surface area of the substrate (e.g., a single 300 mm diameter substrate having a surface area of about 706.5 centimeters squared (cm2), this corresponds with an oxygen containing gas that can have a flow rate of from about 0.03 sccm per cm2 to about 15 sccm per cm2, such as from about 0.7 sccm per cm2 to about 7.25 sccm per cm2, such as from about 2 sccm per cm2 to about 5.75 sccm per cm2. Meanwhile, this corresponds with a halogen containing gas that can have a flow rate of from about 0.007 sccm per cm2 to about 0.3 sccm per cm2, such as from about 0.014 sccm per cm2 to about 0.15 sccm per cm2, such as from about 0.02 sccm per cm2 to about 0.12 sccm per cm2. Further, this corresponds with a hydrogen containing reducing gas that can have a flow rate of from about 0.02 sccm per cm2 to about 0.5 sccm per cm2, such as from about 0.035 sccm per cm2 to about 0.3 sccm per cm2, such as from 0.07 sccm per cm2 to about 0.15 sccm per cm2. In addition, this corresponds with an inert gas that can have a flow rate of from about 0 sccm per cm2 to about 7 sccm per cm2, such as from about 0.007 sccm per cm2 to about 5.75 sccm per cm2, such as from about 0.014 sccm per cm2 to about 4.25 sccm per cm2.

Further, mask removal can be carried out at varying temperature, power, and pressure levels. For example, the temperature during mask removal can range from about 5° C. to about 300° C., such as from about 10° C. to about 150° C., such as from about 15° C. to about 50° C. Additionally, it is to be understood that the substrate to be treated can be preheated, either under vacuum, an atmospheric heat soak, or a lamp base preheat. Additionally, the RF source power for treating 300 mm diameter substrates can range from about 300 W to about 6,000 W, such as from about 1,000 W to about 5,500 W, such as from about 3,000 W to about 5,000 W. Meanwhile, it is to be understood that the source power can be adjusted up or down based on the surface area of the substrate to be treated in the same manner as discussed above for gas flow rates. Thus, for example, when treating a substrate ranging from about 100 mm to about 500 mm in diameter, such as from about 200 mm to about 450 mm in diameter, the source power can range from about 125 W to about 13,500 W, such as from about 425 W to about 12,375 W, such as from about 1,300 W to about 11,250 W.

Moreover, mask removal can be carried out at varying pressures. For instance, the pressure can range from about 1 mTorr to about 4,000 mTorr, such as from about 250 mTorr to about 1,500 mTorr, such as from about 400 mTorr to about 600 mTorr.

In addition, during mask removal, the substrate from which the doped amorphous carbon mask is to be removed can be treated for a specified time based on the CD and aspect ratio of the trenches or channels in the substrate to be treated. For instance, the processing time can range from about 1 second to about 600 seconds, such as from about 5 seconds to about 450 seconds, such as from about 10 seconds to about 300 seconds.

Figure 5:
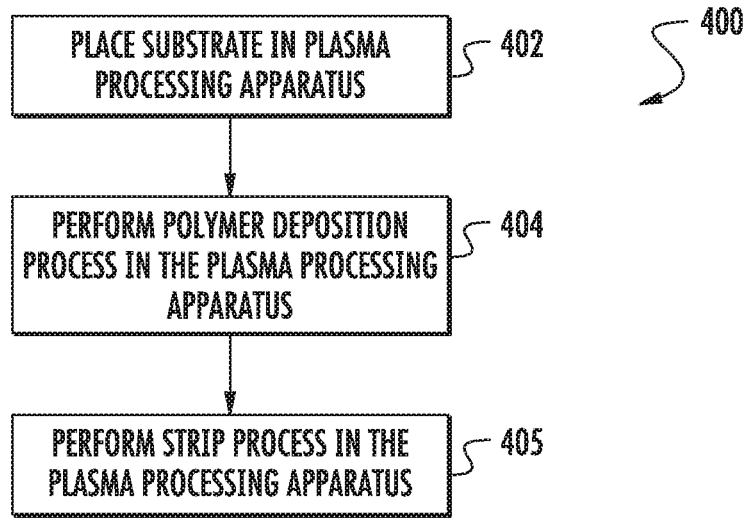
FIG. 5 depicts a flow diagram of an example process for removing a mask layer according to example embodiments of the present disclosure.

FIG. 5 depicts a flow diagram of an example strip process (400) according to example embodiments of the present disclosure. The process (400) can be implemented at least in part, for instance, in one or more plasma processing apparatus, such as that apparatus 100 shown in FIG. 4. In addition, FIG. 5 depicts steps performed in a particular order for purposes of illustration and discussion. Those of ordinary skill in the art, using the disclosures provided herein, will understand that in some embodiments, the steps of any of the methods or processes described herein can be adapted, expanded, rearranged, performed simultaneous, omitted, repeated, and/or modified in various ways without deviating from the scope of the present disclosure.

At (402), the process can include placing a substrate in a plasma processing apparatus. The substrate can include a patterned area having one or more high aspect ratio structures. The substrate can include an unpatterned area that does not include high aspect ratio structures. The one or more high aspect ratio structures can be formed at least in part from alternating layers of oxide and nitride sandwiched between silicon. A doped amorphous carbon mask layer (e.g., boron doped amorphous carbon mask layer) can be included on the patterned area and/or on the unpatterned area. In some cases, the doped amorphous carbon mask layer on the unpatterned area can be thicker than on the patterned area.

At (404), the process can include performing a polymer deposition process in the plasma processing apparatus (e.g., a strip chamber) to deposit a polymer layer on at least a portion of the patterned area of the substrate. As discussed above, in some embodiments, the polymer deposition process can be used to clog one or more high aspect ratio structures on the substrate. In some embodiments, the polymer deposition process can be used to form a polymer layer on a sidewall of the one or more high aspect ratio structures. Any suitable polymer deposition process described herein can used to form the polymer layer on at least a portion of the patterned area of the substrate.

At (406) the process can include performing a plasma strip process in the plasma processing apparatus to remove at least a portion of the polymer layer and the mask layer. The plasma strip process can be any mask removal process described herein. Blocks (404) and (406) can be repeated until the mask layer and/or the polymer layer has been sufficiently removed from the substrate.

Figure 6:
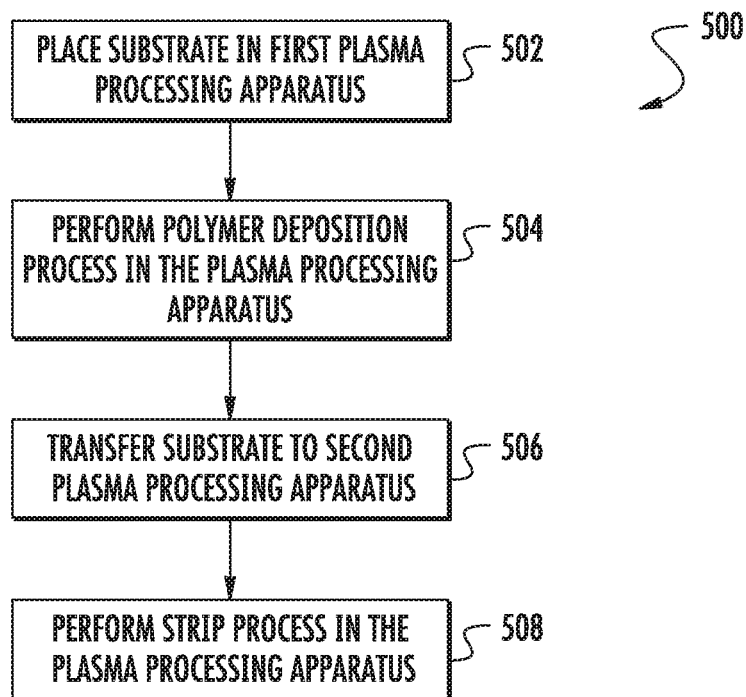
FIG. 6 depicts a flow diagram of an example process for removing a mask layer according to example embodiments of the present disclosure.

FIG. 6 depicts a flow diagram of an example strip process (500) according to example embodiments of the present disclosure. FIG. 6 depicts steps performed in a particular order for purposes of illustration and discussion. Those of ordinary skill in the art, using the disclosures provided herein, will understand that in some embodiments, the steps of any of the methods or processes described herein can be adapted, expanded, rearranged, performed simultaneous, omitted, repeated, and/or modified in various ways without deviating from the scope of the present disclosure.

At (502), the method can include placing a substrate on a substrate holder in a first plasma processing apparatus (e.g., an etch chamber). The substrate can include a patterned area having one or more high aspect ratio structures. The substrate can include an unpatterned area that does not include high aspect ratio structures. The one or more high aspect ratio structures can be formed at least in part from alternating layers of oxide and nitride sandwiched between silicon. A doped amorphous carbon mask layer (e.g., boron doped amorphous carbon mask layer) can be included on the patterned area and/or on the unpatterned area. In some cases, the doped amorphous carbon mask layer on the unpatterned area can be thicker than on the patterned area.

After performing an etch process, the process can include performing a polymer deposition process in the first plasma processing apparatus to deposit a polymer layer on at least a portion of the patterned area of the substrate (504). As discussed above, in some embodiments, the polymer deposition process can be used to clog one or more high aspect ratio structures on the substrate. In some embodiments, the polymer deposition process can be used to form a polymer layer on a sidewall of the one or more high aspect ratio structures. Any suitable polymer deposition process described herein can used to form the polymer layer on at least a portion of the patterned area of the substrate.

At (506), the process can include transferring the substrate to a second plasma processing apparatus. For instance, the process can include transferring the substrate to a strip chamber. FIG. 4 depicts on example strip chamber that can be used according to example embodiments of the present disclosure.

At (508), the process can include performing a plasma strip process in the plasma processing apparatus to remove at least a portion of the polymer layer and the mask layer. The plasma strip process can be any mask removal process described herein.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A process for removing at least a portion of a doped amorphous carbon film from a substrate having a high aspect ratio structure, the process comprising:
   depositing a polymer layer on a top end of the high aspect ratio structure on the substrate; and
   removing at least a portion of the polymer layer and the doped amorphous carbon film from the substrate using a plasma strip process;
   wherein depositing the polymer layer comprises plugging the top end of the high aspect ratio structure with the polymer layer such that the polymer layer extends partially into the high aspect structure so that exposure of an underneath layer associated with the high aspect ratio structure is reduced during the plasma strip process;
   wherein the high aspect ratio structure comprises a trench formed from alternating layers of oxide and nitride, wherein the polymer layer extends only partially into the trench of the high aspect ratio structure.

2. The process of claim 1, wherein depositing the polymer layer comprises forming the polymer layer on a sidewall of the high aspect ratio structure.

3. The process of claim 1, wherein the polymer layer is formed using polymer deposition with one or more of $CHF_3$, $H_2$, $N_2$, Ar or their combination.

4. The process of claim 1, wherein the polymer layer is formed using a gas $C_xH_yF_z$ combined with any $H_2$ or any $C_{x1}H_{y1}$, where x, y, z, x1, and y1 are integers.

5. The process of claim 1, wherein the polymer layer is formed at a pressure in the range of about 10 mTorr to about 5 Torr.

6. The process of claim 1, wherein depositing a polymer layer is performed in an etch chamber and removing at least a portion of a polymer layer and the doped amorphous carbon film is performed in a strip chamber that is separate from the plasma chamber.

7. The process of claim 1, wherein depositing the polymer layer and removing at least the portion of the polymer layer and the doped amorphous carbon film are performed in a single chamber.

8. The process claim 1, wherein depositing the polymer layer and removing at least the portion of the polymer layer and the doped amorphous carbon film are repeated until the doped amorphous carbon film is removed from the substrate.

9. The process of claim 1, wherein the plasma strip process uses a plasma formed using a mixture of an oxygen containing gas, a halogen containing gas, and a reducing gas that includes hydrogen.

10. The process of claim 9, wherein a ratio of the reducing gas to the halogen containing gas is in the range of about 0.001:1 to about 3:1.

11. The process of claim 1, wherein the doped amorphous carbon film is a boron doped amorphous carbon film.

* * * * *